US 6,716,289 B1

(12) United States Patent
Sillmon et al.

(10) Patent No.: US 6,716,289 B1
(45) Date of Patent: *Apr. 6, 2004

(54) RIGID GAS COLLECTOR FOR PROVIDING AN EVEN FLOW OF GASSES

(75) Inventors: Roger Sillmon, Troutville, VA (US); Khang V. Nguyen, Salem, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 197 days.

This patent is subject to a terminal disclaimer.

(21) Appl. No.: 09/993,613

(22) Filed: Nov. 27, 2001

Related U.S. Application Data

(63) Continuation-in-part of application No. 09/884,944, filed on Jun. 21, 2001, which is a continuation-in-part of application No. 09/635,268, filed on Aug. 9, 2000, now Pat. No. 6,325,855.

(51) Int. Cl.⁷ .................. C23C 16/00; H01L 21/306
(52) U.S. Cl. .................. 118/733; 118/715; 156/345.29
(58) Field of Search ................ 118/715, 733; 156/345.29

(56) References Cited

U.S. PATENT DOCUMENTS

| 4,976,217 | A | | 12/1990 | Frijlink | 118/715 |
|---|---|---|---|---|---|
| 5,441,568 | A | * | 8/1995 | Cho et al. | 118/715 |
| 5,558,717 | A | * | 9/1996 | Zhao et al. | |
| 5,582,866 | A | | 12/1996 | White | 427/248.1 |
| 5,846,330 | A | | 12/1998 | Quirk et al. | 118/723 DC |
| 5,885,356 | A | * | 3/1999 | Zhao et al. | 118/723 ER |
| 5,895,530 | A | * | 4/1999 | Shrotriya et al. | 118/715 |
| 6,325,855 | B1 | * | 12/2001 | Sillmon et al. | 118/715 |
| 6,423,949 | B1 | * | 7/2002 | Chen et al. | 219/444.1 |
| 6,478,877 | B1 | * | 11/2002 | Sillmon et al. | 118/733 |
| 6,530,992 | B1 | * | 3/2003 | Yang et al. | 118/695 |
| 6,582,522 | B2 | * | 6/2003 | Luo et al. | 118/715 |
| 2002/0017244 | A1 | * | 2/2002 | Sillmon et al. | 118/715 |
| 2003/0136520 | A1 | * | 7/2003 | Yudovsky et al. | 156/345.51 |
| 2003/0148035 | A1 | * | 8/2003 | Lingampalli | 427/421 |

FOREIGN PATENT DOCUMENTS

| GB | 1 215 140 A | 12/1970 |
|---|---|---|
| WO | WO 00/04205 | 1/2000 |

OTHER PUBLICATIONS

"Layer uniformity in a multiwafer MOVPE reactor for III–V compounds" P.M. Frijlink et al., *Journal of Crystal Growth*, North–Holland Publishing Co., Amsterdam, NL, vol. 107, No. 1 / 4, 1991, pp. 166–174, XP000246591, ISSN: 0022–0248.

* cited by examiner

*Primary Examiner*—Jeffrie R. Lund
(74) *Attorney, Agent, or Firm*—McDermott, Will & Emery

(57) ABSTRACT

A gas collector for collecting gasses from within a reaction chamber of a reactor comprises a body having a conduit, at least one inlet, an outlet, and a seal disposed on the body. The seal cooperates with a lid of the reactor to prevent escape of reaction gasses from the reaction chamber. The body includes first and second members and is formed from graphite. The seal is formed from molybdenum and is ring-shaped with a generally crescent-shaped cross-section and inner and outer edges. A top surface of the body includes a pair of concentric slots into which the inner and outer edges are respectively positioned. The first and second members can be detachably connected to one another, and the first and second members can be stationary relative to one another during operation of the gas collector.

18 Claims, 4 Drawing Sheets

RIGID GAS COLLECTOR FOR PROVIDING AN EVEN FLOW OF GASSES

CROSS REFERENCE TO RELATED APPLICATIONS

This application is a continuation-in-part of U.S. application Ser. No. 09/884,944, filed Jun. 21, 2001, now pending, which is a continuation-in-part of U.S. application Ser. No. 09/635,268 filed Aug. 9, 2000, now U.S. Pat. No. 6,325,855 both incorporated herein by reference.

FIELD OF THE INVENTION

The present invention relates to epitaxial reactors and, more particularly, to a gas collector for epitaxial reactors.

BACKGROUND OF THE INVENTION

Continuing advances in the semiconductor industry have resulted in the development of highly complex thin-film deposition processes for fabricating semiconductor devices that are packaged for use in the manufacture of sophisticated electronic devices. The thin films of material that are deposited on the semiconductor wafers are often referred to as epitaxial layers. High speed electronic transistors, quantum-well diode lasers, light-emitting diodes, photodetectors, and optical modulators incorporate structures composed of numerous epitaxial layers ranging in thickness from several microns to as thin as a few tenths of a nanometer. These epitaxial layers are typically deposited, or grown, on a single-crystal substrate, i.e., the semiconductor wafer.

One method of forming epitaxial layers on a semiconductor wafer is known as chemical vapor deposition (CVD). In a typical manufacturing process of a wafer, for example, silicon or gallium arsenide in extremely pure crystalline form is overlaid sequentially with numerous layers of materials, which function as conductors, semiconductors, or insulators. Each subsequent layer is ordered and patterned such that the sequence of layers forms a complex array of electronic circuitry. The semiconductor wafer can then be subsequently cut along predetermined scribe lines into individual devices, commonly referred to as "chips." These chips ultimately function as key components in electronic devices ranging from simple toys to complex supercomputers.

CVD processes normally take place within a reaction chamber. Initially, the semiconductor wafer is placed within a reaction chamber containing an inert atmosphere, and the temperature within the reaction chamber is elevated. Reaction gasses containing the compound or element to be deposited are then introduced to react with the surface of the semiconductor wafer, which results in deposition of the required film onto the semiconductor wafer. The reacted gasses are continually introduced and removed from the reaction chamber until a requisite film thickness has been achieved.

An example of an epitaxial reactor is described in U.S. Pat. No. 4,961,399, to Frijlink, which is incorporated herein by reference. This patent describes a reactor into which reaction gasses are introduced via a quartz funnel that is located at the center of the reactor. The reaction gasses then flow radially outward towards a quartz ring that bounds the reactor. Along the circumference of the quartz ring are equidistant slits, which collect the reacted gasses. Bounding the upper portion of the reaction chamber is a quartz disk. The quartz disk seals against O-rings, witch are positioned behind the quartz ring. Because quartz is a brittle and inflexible material, the quartz disk does not seal against the quartz ring. Instead, a gap is provided between the quartz disk and the quartz ring to prevent chipping of either.

This gap between the quartz disk and the quartz ring can cause problems within the reactor. For example, reaction gasses can escape through the gap and can form deposits outside the reaction chamber, and these deposits can interfere with the working of the reaction chamber and can also flake off and act as contaminants. Although a narrower gap can be provided, if a hard foreign body wider than the gap is introduced into the gap, such as during the opening of the reaction chamber, the foreign body could prevent the quartz disk from sealing properly over the reaction chamber or can cause chipping of either the quartz disk or the quartz ring.

An attempted solution to the above-described problems is disclosed in U.S. Pat. No. 4,976,217 to Frijlink, which is incorporated herein by reference. This patent describes a collecting crown or gas collector, which is both used to collect reaction gasses from the reaction chamber and also to provide a seal between the reaction chamber and a quartz disk or cover.

The gas collector and reaction chamber of the prior art is illustrated in FIGS. 1 and 2. The gas collector 1 is mounted on a supporting platform 4 by a horizontal plate 10 that rests upon the supporting platform 4. The supporting platform 4 is typically formed from quartz and is positioned within a cylindrical body 19 of the reactor that surrounds the reaction chamber and the gas collector 1. The cover 8 of the reaction chamber bounds the top of the reaction chamber and seals against the upper ridge 6 of the gas collector 1 and against toric joints 20 within the cylindrical body 19.

The gas collector 1 is further illustrated in FIG. 3. The gas collector 1 is formed from a folded plate of molybdenum having elastic properties. The molybdenum plate is folded along horizontal folding lines 13 and vertical folding lines 14 to form multiple flat plates 17, 5, 18, 9, 3, 10 that are connected to one another along the folding lines 13, 14. Also, two plates 2, 3 are touching without being fixed to each other. The combination of plates 17, 5, 18, 9, 3, 10 form a conduit 30 that encircles the reaction chamber. One of the plates 17 includes regularly spaced inlets holes 12 that collect the reaction gasses from the reaction chamber. Instead of the inlet hole 12, as shown below on the right-hand side of FIG. 3, the wall plate 17 can be provided with folded lower projections 15, which separate the movable lower edge 2 away from the fixed edge 3 to leave a slot between the edges 2, 3 through which the reaction gas can then pass.

The '217 patent states that an essential element of the gas collector 1 is the vertical baffle plate, which is constituted by plates 17, 3 with the lower edge 2 of the upper plate 17 being pressed with a sliding motion against the upper edge of the lower plate 3. The horizontal plates 10 that are connected to the lower plates 3 serve to place the gas collector 1 on the edge of the platform 4. Furthermore, the top plate 5 is inclined and includes an upper ridge 6.

The disclosed gas collector 1 suffers several problems. A non-exhaustive list of these problems include contamination of the periphery 11 of the platform, the top plate 5, and the cylindrical body 19; uneven gas flow and gas density of the reaction gasses through the reaction chamber; and contamination within the reaction chamber. Many of these problems stem from the gas collector 1 being completely formed from a sheet of molybdenum, which is folded along folding lines 13, 14. Sheet metal structures are very difficult to manufacture to a high degree of dimensional precision. For example, the bending of the sheet metal along the folding lines 13, 14 is imprecise at best. Furthermore, the gas collector 1 is constructed using small screws and nuts, which do not lend themselves to maintaining a high degree of dimensional precision.

The gas collector 1 being formed by sheet metal, therefore, provides poor dimensional precision or tolerances for both the horizontal plate 10 extending over the platform 4; the positions of the inlets 12 in the upper plate 17; the connections of the upper plates 17 with one another, and the ridges 6 of the top plate 5. Another reason for the poor dimensional tolerances of the gas collector 1 results from thermal stressing of the sheet metal during the deposition process. As the thin molybdenum sheet metal of the gas collector 1 expands and contracts during each process cycle, the gas collector 1 eventually buckles and warps, thereby destroying the dimensional integrity of the gas collector 1.

The result of these poor dimensional tolerances is that the gas collector 1, although purporting to seal the reaction gasses within the reaction chamber except through the inlets holes 12, provides numerous locations for the reaction gasses to escape the reaction chamber. For example, the ridge 6 often fails to complete seal the gas collector 1 against the cover 8. As such, reaction gasses are free to flow past the ridge 6 and form deposits, for example, on the top plate 5, rear plate 18, and on the cylindrical body 19.

The deposits formed on the gas collector 1 and cylindrical body 19 require frequent cleaning of both the gas collector 1 and the cylindrical body 19. For example, in one application, the disclosed gas collector 1 was being cleaned after approximately every 20 process cycles. Furthermore, because the gas collector 1 is formed by molybdenum sheet metal, the deposits on the gas collector 1 are very difficult to remove without damaging the gas collector 1. This limits the number of cleanings of a particular gas collector 1, on average, to three times before the gas collector 1 is replaced.

A disadvantage of having deposits on the gas collector 1 is that the deposits can flake off and contaminate the inside of the reactor. These flakes can interfere with the deposition process on the semiconductor wafers and can cause the subsequent rejection of the wafers. With the disclosed gas collector 1 of the prior art, for example in one application, approximately 13.5% of the wafers are rejected for contamination caused by flakes.

The flakes are caused, for example, because the gas collector 1 is formed from molybdenum sheet metal. Molybdenum is a material onto which deposits cannot firmly adhere. As such, these deposits can easily flake off when stressed. Flexing of the molybdenum sheet metal creates the stresses within the deposits that cause the formation of the flakes or chips. The sheet metal flexes for several reasons, one of which is that the gas collector is formed from sheet metal, and sheet metal is notorious for flexing, which also relates to why constructs made from sheet metal have poor positional tolerances. A second reason is that the gas collector 1 is designed to be flexed. As stated above, the plates 3, 9, 18, 5 constitute a spring; and therefore, any deposits formed on the plates 3, 9, 18, 5 are subject to stress during the opening and closing of the cover 8. Still another reason for flexing is that molybdenum expands and contracts because of the heating and cooling of the gas collector 1 during a process cycle.

The reactor disclosed above in U.S. Pat. No. 4,961,399, with which the gas collector 1 of the prior art is used, is designed such that reaction gasses flow evenly from the center of the reaction chamber outward into the gas collector 1. A flow is considered even if the gas densities and velocities at a given radius away from the center of the reaction chamber are substantially equal. If the reaction gasses are not flowing evenly from the center of the reaction chamber, the deposition process varies depending upon the location of the wafers within the reaction chamber because the densities of the various constituents of the reaction gasses also vary. As such, the thickness and quality of the deposition can vary from one wafer to the next, even within the same batch process. For example, when depositing $Al_xGaAs$ using the gas collector 1 of the prior art, the percentage (x) of aluminum being deposited varies not only from one batch of wafers to the next, but also varies within wafers in single batch and also within a single wafer.

Obtaining an even flow of reaction gasses, however, is difficult with the gas collector 1 of the prior art. An even flow of reaction gasses results from the gas collector 1 providing an identical pressure differential between the reaction chamber and the conduit 18 inside the gas collector 1. As stated above, however, the gas collector 1 of the prior art is constructed with poor positional tolerances which provide gaps between the ridge 6 and the cover 8; gaps between adjacent front plates 17; and gaps between the horizontal plate 10 and the platform 4. Additionally, the holes used to form the bending lines 13, 14 also provide additional gaps in the gas collector 1. These gaps are not consistent along the circumference of the gas collector 10 and create different pressure differentials along the circumference, which therefore causes the reaction gasses to have different flow patterns depending upon the radial direction the reaction gasses flow.

Furthermore, the inlet holes 12 are positioned on a front plate 17 that is movable relative to the platform 4. This movement of the inlet holes 12 relative to the reaction chamber can change each time the cover 8 is raised and lowered and causes different flow rates that can vary during each batch process and/or from each gas collector 1. For example, the amount of pressure placed on the gas collector 1 when the cover 8 of the reactor is closed can vary, and this can cause the positions of the inlet holes 12 to vary. Also, for example, the positions of the inlet holes 12 can vary even if the pressure of the cover 8 remains the same because the flexibility of sheet metal forming the gas collector 1 varies over time. Furthermore, because the gas collector 1 of the prior art is made from sheet metal and is constructed used small screws, the flexibility or springiness of a particular gas collector 1 cannot be formed consistently, and therefore, the springiness varies from one gas collector 1 to the next. These positional variations of the inlet holes 12 cause the flow pattern of reaction gasses through the reaction chamber to change, and this change of the gas flow pattern affects the deposition process. Thus, the positioning of inlets 12 in a member movable relative to the reaction chamber causes an undesirable variance in the deposition process.

There is therefore a need for a gas collector that prevents the problems of the prior art, which include leakage of reaction gasses past the gas collector; flakes formed during the flexing of the gas collector; and uneven flow caused by the various gaps introduced into the gas collector.

SUMMARY OF THE INVENTION

This and other needs are met by embodiments of the present invention which provide a gas collector for collecting gasses from within a reaction chamber of a reactor. The gas collector includes a seal and a rigid body, in which is defined a conduit, at least one inlet, and an outlet. The seal cooperates with a removable lid of the reactor to prevent escape of the gasses from the reaction chamber. Also, the inlets direct the gasses from the reaction chamber into the conduit, and the outlet exhausts the gasses from the conduit into an exhaust pipe of the reactor. Furthermore the body can be formed from graphite.

By providing a rigid body, flexing of the body is reduced, which reduces the amount of flakes or contaminants generated within the gas collector. Furthermore, a rigid body also provides a more even flow through the gas collector by reducing variations in hole sizes and locations, which are also caused by flexing of the body. Additionally, because the rigid body can be formed to higher tolerances than a flexible body, leakage of reaction gasses past the gas collector can be reduced.

In one aspect of the invention, the seal is formed from molybdenum and is ring-shaped with a generally crescent-shaped cross-section and inner and outer edges. A top surface of the body can also include a pair of concentric slots into which the inner and outer edges are respectively positioned. The seal can also include symmetrically positioned slots around the outer edge of the seal.

In another aspect of the invention, the first and second members can be detachably connected to one another. Also, the first and second members can be stationary relative to one another during operation of the gas collector.

Additional advantages of the present invention will become readily apparent to those skilled in this art from the following detailed description, wherein only an exemplary embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout and wherein.

DETAILED DESCRIPTION OF THE INVENTION

Figure 1:
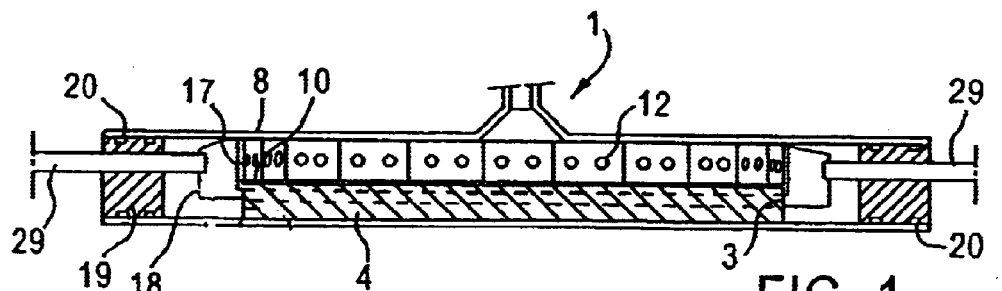
FIG. 1 is a side cross-sectional view of a gas collector and reactor in accordance with the prior art.
Figure 2:
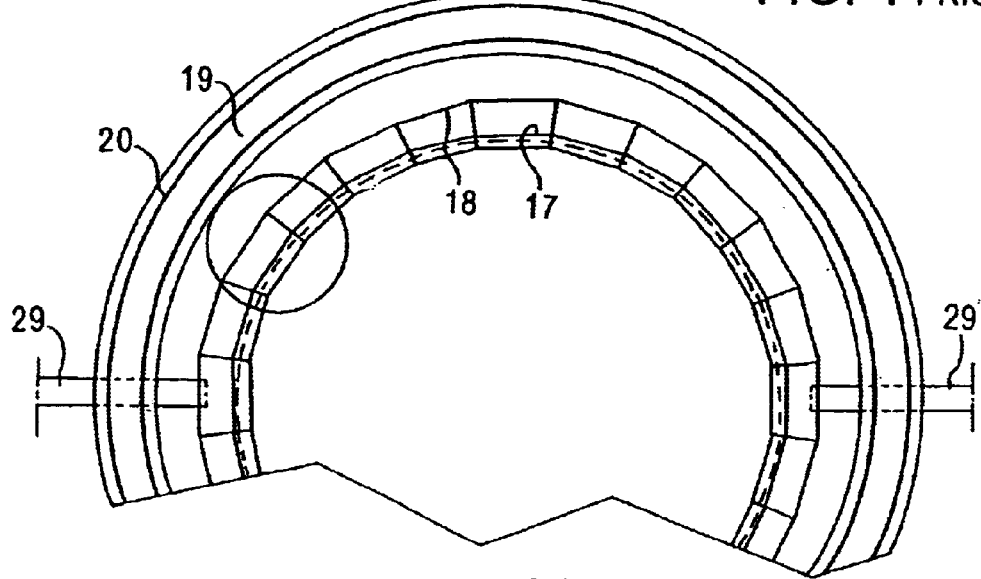
FIG. 2 is a plan view of the reactor shown in FIG. 1 with the cover removed.
Figure 3:
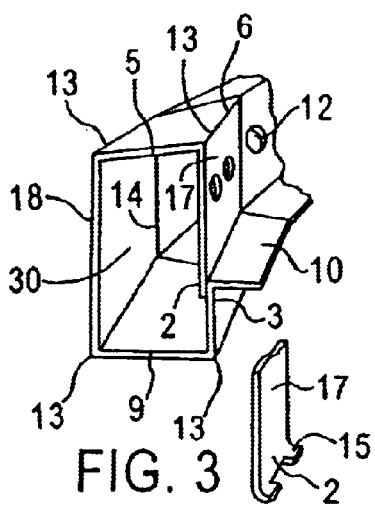
FIG. 3 is a perspective cross-sectional view of the gas collector in FIG. 1.
Figure 4:
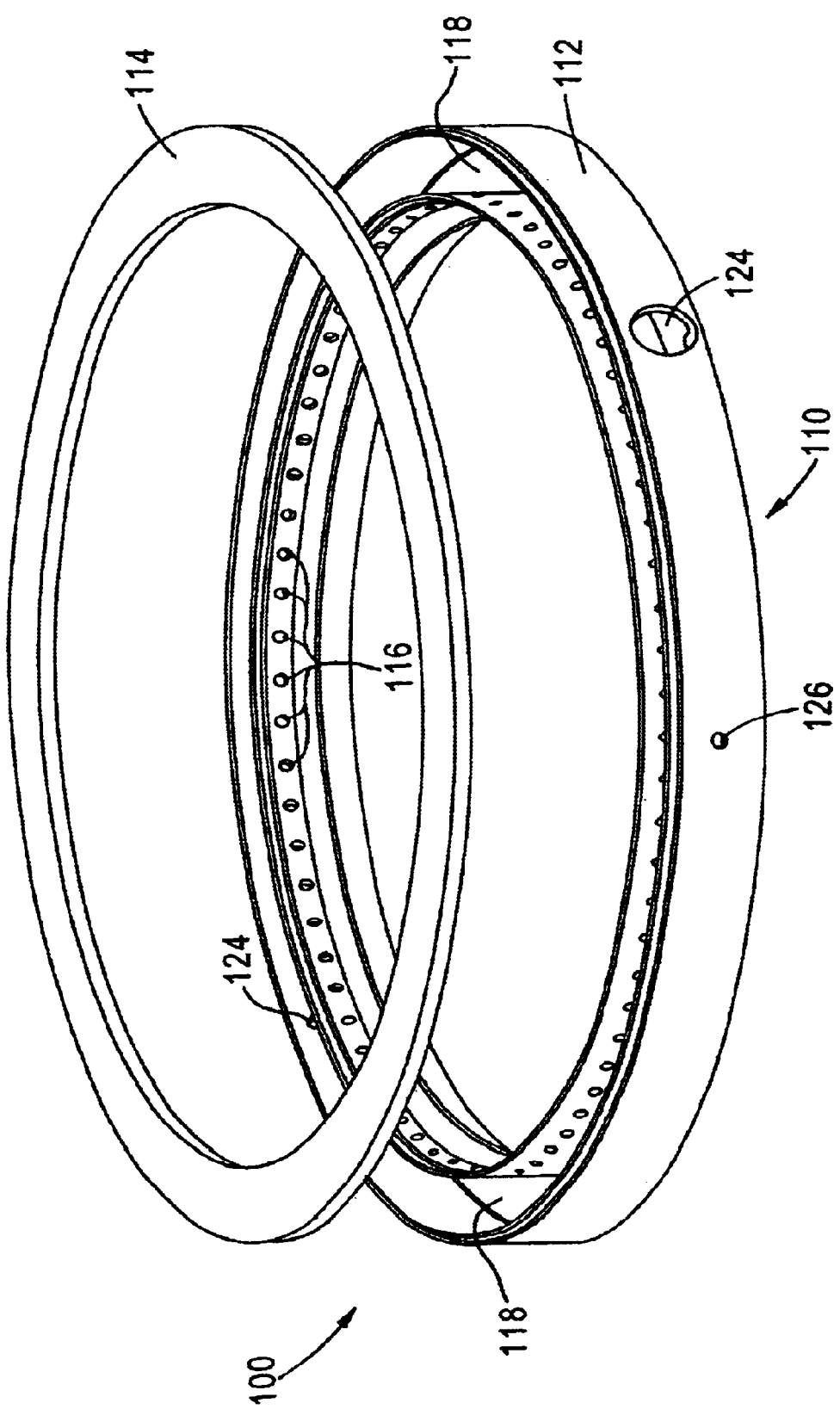
FIG. 4 is an exploded view of a gas collector constructed in accordance with the present invention.
Figure 5:
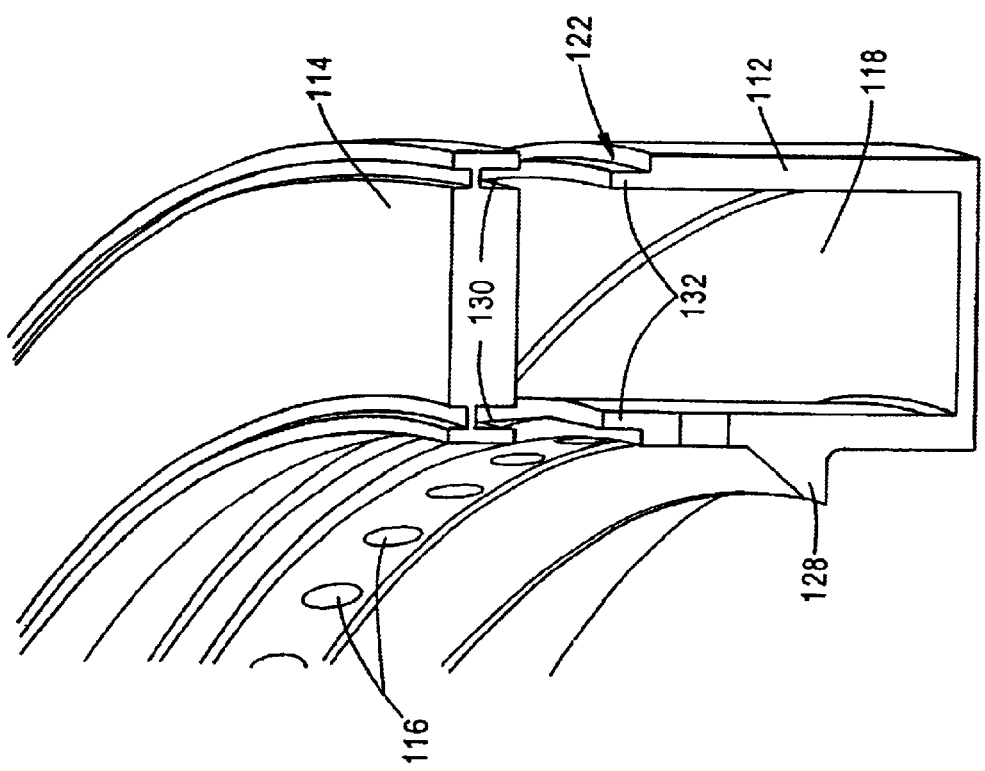
FIG. 5 is a perspective cross-sectional view of the gas collector.

A gas collector according to one aspect of the invention is illustrated in FIGS. 4 and 5. The gas collector 100 includes a body 110 having at least one inlet 116 for receiving gasses from the reaction chamber (best shown in FIGS. 1 and 2) of a reactor. In certain aspects of the invention, the gas collector is used with a reactor, although the gas collector is not limited in its use as to a particular type of reactor. For example, the gas collector can be used with an epitaxial reactor. Examples of materials capable of being deposited with the reactor include type III–IV compound semiconductors. Illustrative examples of these are GaAs, AlGaAs and InGaAs.

In one aspect of the invention, at least two members 112, 114 are combined to form the body 110. The members 112, 114 of the body 110, either individually or in combination, receive gasses from within the reaction chamber of the reactor and also cooperate with the reactor to form a seal that reduces the escape of gasses from the reaction chamber. The gas collector 100 collects chemical vapors (i.e., reaction gasses from chemical vapor deposition) into a conduit 118 from the reaction chamber of the reactor and directs the reaction gasses to the reactor's exhaust pipes (shown in FIG. 2 with reference number 29) through outlets 124 formed in a outer wall of the body 110. Although not limited in this manner, the gas collector 100 can include at least one secondary inlet 126 formed in the outer wall of the body 110 to facilitate introduction of a purge gas into the conduit 118. Besides the inlet and outlet holes 116, 126, 124, in one aspect of the invention, the body 110 surrounds the conduit 118 and prevents escape of gasses from within the conduit 118.

In one aspect of the invention, the members 112, 114 are detachably connected to one another. In this manner, the members 112, 114 can be detached from another so as, for example, to facilitate the cleaning of the conduit 118. In use, however, the members 112, 114 are attached so as to reduce the escape of reaction gasses from the conduit 118 through an interface between the first and second members 112, 114. In so doing, the members 112, 114 can be stationary relative to one another during operation, and an advantage of this is that the members 112, 114 can define a constant volume conduit 118. By having a constant volume conduit 118, the flow of gasses into and through the gas collector 100 can be more easily predicted, and an even flow of gasses into and through the gas collector 100 can be more easily provided.

Although the manner is which the members 112, 114 are detachably connected is not limited as such, inter-member seals 122 can be provided between the first and second members 112, 114 to reduce the escape of reaction gasses. In a current aspect, an inter-member seal 122 includes a female portion 130 and a male portion 132 interengaging with one another. The female portion 130 is positioned on either the first member 112 or the second member 114 and the male portion 132 is positioned on the opposite member, which is respectively the second member 114 or the first member 112.

The body 110 includes at least one outlet 124 through which reaction gasses in the conduit 118 can be exhausted to the exhaust pipe of the reactor. The outlets 124 can be formed in any of the members 110, 112, and the outlets 124 are not limited as to a particular shape or size nor are the outlets 124 limited as to a particular distribution pattern in the members 110, 112. In a current aspect, multiple outlets 124 are provided in the body 110 such that the outlets 124 provide an even pressure differential along the circumference of the conduit 118. In this manner, the reaction gasses flow uniformly from the reaction chamber, through the inlets 116 into the conduit 118, and from the conduit through the outlets 124 and into the exhaust pipe.

The gas collector 100 receives gasses from within the reaction chamber through inlets 116 in the portion of the body 110 adjacent the reaction chamber. The inlets 116 can be formed in any of the members 110, 112, and the inlets 116 are not limited as to a particular shape or size nor are the inlets 116 limited as to a particular distribution pattern in the members 110, 112. For example, the shape of the inlets 116 can be narrow slits, oval, or as illustrated, circular. Additionally, the body 110 can have inlets 116 with different shapes and/or sizes.

In a current aspect of the gas collector 100, the inlets 116 are provided on the gas collector 100 so as to create a even flow of gasses from within the reaction chamber into the gas collector 100. An even flow of gasses through the reaction chamber is obtained when the gasses in any position within the reaction chamber at a given radial distance away from the center of the reaction chamber have substantially equal pressures. In this manner, the flow of gasses through the reaction chamber are not skewed in certain directions, such as what occurs with the gas collector of the prior art.

Although not limited in this manner, at least one of the members 112, 114 of the body 110 can be rigid. A member 112, 114 that is rigid advantageously reduces flexing of the body 110, which can cause variations in the gas flow pattern in the reaction chamber and can also cause the leakage of gas from within the reaction chamber. Also, having a rigid member 112, 114 allows for closer control of dimensional tolerances, which allows for a tighter fit between the gas collector 100 and the reactor. The tighter fit between the gas collector 100 and the reactor also reduces the leakage of gasses from within the reaction chamber. Because the leakage of gasses from within the reaction chamber through other orifices other than the inlets 116 can disadvantageously modify the flow of gasses through the reaction chamber, the tighter fit between the gas collector 100 and the reactor can advantageously aid in providing an even flow of gasses through the reaction chamber. In a current aspect of the gas collector 100, the body 110 and, therefore, both the first and second members 112, 114 are rigid.

The members 112, 114 of the body 110 can be formed from any material capable of withstanding, without degradation, the process conditions resulting from use of the reactor. For example, when depositing GaAs, the temperature within the reaction chamber of the reactor reaches about 700° C., and the temperature at the gas collector reaches around 600–650° C. The temperature for other processes reach as high as about 1200° C. within the reaction chamber, although even higher temperatures are possible. An illustrative example of a material capable of withstanding the process conditions is Inconel, produced by Inco Alloys International.

Although not limited in this manner, the members 112, 114 of the body 110 can also be formed from a material that does not produce contaminants, such as outgassing, at the aforementioned temperatures. Contaminants can disadvantageously introduce additional reactants or particles into the reaction chamber that may interfere with the deposition process. An example of a material that does not produce contaminants is a high purity material, such as titanium.

Again, although not limited in this manner, the members 112, 114 of the body 110 can be formed from a material onto which the deposition material better adheres. In so doing, the extent of deposition material flaking off the gas collector 100 can be reduced because of the better adherence of the deposition material. As is known by those skilled in the art, examples of material properties that affect adherence include surface texture-and porosity. An illustrative example of a material that provides good adherence for deposition materials is graphite.

In a current aspect of the invention, at least one of the members 112, 114 of the body 110 is formed from graphite. Graphite advantageously remains stable at high temperatures and does not outgas any contaminants or particles. Furthermore, reaction materials such as GaAs readily adhere to graphite, and graphite is a rigid material that resists flexing. As such, the use of graphite to form the members 112, 114 is particularly advantageous in preventing flaking of the reaction material deposited on the members 112, 114. In addition, graphite has good machinability, which allows for a closer control of dimensional tolerances. Furthermore, because graphite is substantially rigid, the body 110 will also be rigid, and as previously discussed, a rigid body 110 promotes a more consistent flow of reaction gasses through the reaction chamber. Although in one aspect of the invention, the members 112, 114 of the body 100 are formed from machinable graphite, the invention is not limited in this manner. Any materials having similar properties, as discussed above, to graphite, are acceptable for use with the invention. Furthermore, other forms of graphite, such as graphite fibers and composites, are also acceptable for use with the invention.

The body 110 being made from a machinable material, such as graphite, also allows the portion of the body 110 adjacent the reaction chamber to be substantially circular. In contrast, the gas collector of the prior art is formed from multiple polygons; and therefore, portion adjacent the reaction chamber is not substantially circular. By forming the portion of the gas body 110 adjacent the reaction chamber to be substantially circular, the radial flow of reaction gasses into the gas collector 100 is more consistent.

The body 110 can include one or more lips 128 extending from the body 110 adjacent the inlets 116. In a current aspect, the lip 128 slopes horizontally inward towards the reaction chamber and vertically away from the inlet 116. In this manner, one or more lips 128 can shape the flow of gasses into the inlets 116 of the gas collector 100.

The gas collector 100 according to an aspect of the invention includes a seal between the body 110 and the lid of the reactor, and the seal acts to reduce the escape, between the body 110 and the lid, of reaction gasses from the reaction chamber. In operation, the seal is typically engaged after the lid is lowered onto the body 110. The seal can be located on the lid or body 110. Alternatively, different portions of the seal can be respectively located on both the lid and body 110.

The invention is not limited as to a particular seal between the body 110 and the lid. However, in a current aspect of the invention, as illustrated in FIGS. 6–9, the seal 150 includes a strip of flexible material, which is positioned on a top portion 148 of the body 110. Although not limited to a particular shape, the seal 150 can be in the shape of a ring having an inner and outer edges 156, 158. The ring can then be bent to form a generally crescent-shaped cross-section (best shown in FIG. 8).

Figure 7:
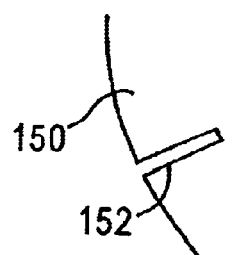
FIG. 7 is a partial plan view of the seal shown in FIG. 5 illustrating notches formed in the seal.
Figure 8:
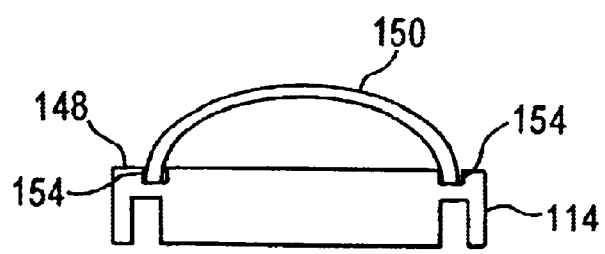
FIG. 8 is a partial cross section of the gas collector and seal.

As shown in FIG. 7, the ring can include slots 152 along the outer edge 158 of the ring. Although not limited in this manner, the slots 152 are regularly spaced and enable the ring to bent to form the generally crescent-shaped cross-section. As an illustrative example, for a ring with an inside diameter of approximately 14 1/16 " and an outside diameter of 15 3/8", the slots 152 can be positioned every 5° along the ring and have a width of approximately 0.010" and a depth of approximately 0.066".

The ring can be formed from any material capable of withstanding the process conditions that occur during use of the reactor. For example, the temperature within the reaction chamber of the reactor can reach about 700° C. during the deposition of GaAs and the temperature at the gas collector can reach around 600–650° C. The temperature within the reaction chamber for other processes can reach as high as about 1200° C. In one aspect of the invention, the ring is formed from a material that also does not produce contaminants, such as outgassing, at the aforementioned temperatures, and in a present aspect of the invention, the ring is formed from high-purity molybdenum.

Figure 6:
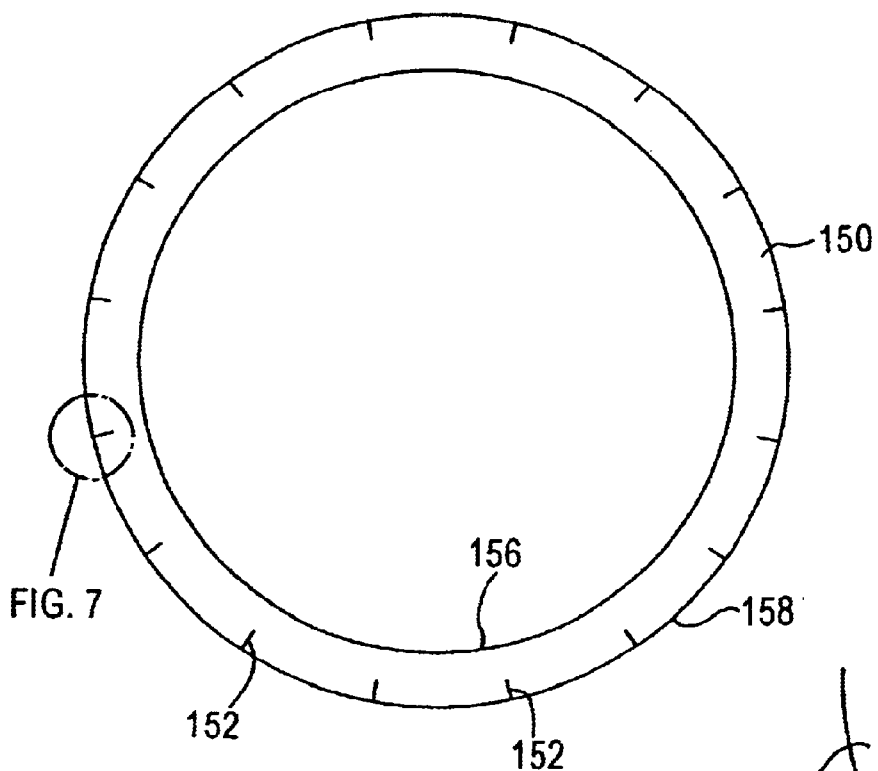
FIG. 6 is a top plan view of a seal used in conjunction with the gas collector of FIG. 4.

The seal 150 is not limited as to a particular manner in which the seal 150 is attached to the body 110, and any manner of attaching the seal 150 to the body 110 is acceptable for use with the invention. However, in one aspect of the invention, when the ring illustrated in FIG. 6 is used as the seal 150, an upper member 114 of the body 110 can be provided with a pair of concentric groves 154 into which the inner and outer edges 156, 158, of the ring 150 can be respectively inserted. The ring 150 can be easily inserted into or removed from the groves 154. In this manner, the ring 150 can be advantageously removed, such as for cleaning or complete replacement, without the need to remove or replace the body 110 to which the seal 150 is attached.

Figure 9:
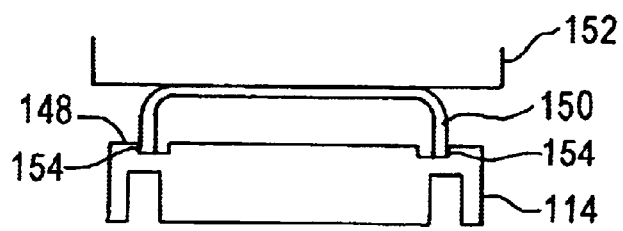
FIG. 9 is a partial cross section of the gas collector and seal with the seal being compressed by a lid of the reactor.

In operation, as illustrated in FIG. 9, the lid 152 of the reactor is lowered onto the ring 150. The ring 150 is then compressed, and the flexibility of the ring 150 advantageously enables a seal to be formed between the lid 152 and ring 150. During the lowering of the lid, the upper member 114 and body 110 can remain rigid, and in so doing, the problems previously discussed associated with a flexible body can be avoided.

By providing a rigid body, the amount of flakes or contaminants being generated with the gas collector of the present invention can be decreased. A rigid body also provides a more even flow through the gas collector by reducing variations in hole sizes and locations, which are also caused by flexing of the body. Additionally, because the rigid body can be formed to higher tolerances than a flexible body, leakage of reaction gasses past the gas collector can advantageously be reduced.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only an exemplary aspect of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A gas collector for collecting gasses from within a reaction chamber of a reactor, the reactor including a removable lid for enclosing the reaction chamber, comprising:

a rigid body defining a conduit within said body, at least one inlet, and at least one outlet; and a seal disposed on said body for cooperating with the lid to prevent escape of the gasses from the reaction chamber.

2. The gas collector according to claim 1, wherein said body includes a first member and a second member.

3. The gas collector according to claim 2, wherein during operation of said gas collector, said first and second members are stationary relative to one another.

4. The gas collector according to claim 2, wherein said first and second members are detachably connected to one another.

5. The gas collector according to claim 1, wherein said conduit has a constant volume.

6. The gas collector according to claim 1, wherein said body includes graphite.

7. The gas collector according to claim 1, wherein said seal is disposed on a top surface of said body and between said body and the lid.

8. The gas collector according to claim 1, wherein said seal is formed from molybdenum.

9. The gas collector according to claim 1, wherein said seal is ring shaped with inner and outer edges.

10. The gas collector according to claim 9, wherein said seal includes slots on said outer edge.

11. The gas collector according to claim 10, wherein said slots are symmetrically position around said outer edge.

12. The gas collector according to claim 9, wherein said seal is generally crescent-shaped in cross-section.

13. The gas collector according to claim 9, wherein top surface includes a pair of concentric slots and said inner and outer edges are respectively positioned within said concentric slots.

14. The gas collector according to claim 9, wherein said seal is detachably connected to said body.

15. A gas collector for collecting gasses from within a reaction chamber of a reactor, the reactor including a removable lid for enclosing the reaction chamber, comprising:

a rigid graphite body defining a constant-volume conduit within said body, at least one inlet, and at least one outlet;

said body including first and second members detachably connected to one another, said first and second members stationary relative to one another during operation of said gas collector;

a ring-shaped seal having a generally crescent-shaped cross-section disposed on a top surface of said body for cooperating with the lid to prevent escape of the gasses from the reaction chamber, said seal having inner and outer edges with said outer edge including symmetrically-positioned slots, said top surface including a pair of concentric slots into which said inner and outer edges are respectively positioned.

16. The gas collector according to claim 15, wherein said seal is formed from molybdenum.

17. The gas collector according to claim 15, wherein said seal is detachably connected to said body.

18. The gas collector according to claim 15, wherein said seal is disposed between said body and the lid.

* * * * *